United States Patent
Lee et al.

(10) Patent No.: US 12,198,759 B2
(45) Date of Patent: Jan. 14, 2025

(54) MEMORY CIRCUIT AND METHOD FOR READING MEMORY CIRCUIT

(71) Applicant: Taiwan Semiconductor Manufacturing Company, Ltd., Hsinchu (TW)

(72) Inventors: Hengyuan Lee, Hsinchu County (TW); Yu-Sheng Chen, Taoyuan (TW); Xinyu Bao, Fremont, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 156 days.

(21) Appl. No.: 18/163,297

(22) Filed: Feb. 2, 2023

(65) Prior Publication Data
US 2024/0144999 A1    May 2, 2024

Related U.S. Application Data

(60) Provisional application No. 63/419,711, filed on Oct. 27, 2022.

(51) Int. Cl.
*G11C 11/00* (2006.01)
*G11C 13/00* (2006.01)

(52) U.S. Cl.
CPC .... *G11C 13/004* (2013.01); *G11C 2013/0054* (2013.01); *G11C 2213/72* (2013.01)

(58) Field of Classification Search
CPC .......... G11C 13/004; G11C 2013/0054; G11C 2213/72; G11C 13/003; G11C 13/0004
See application file for complete search history.

(56) References Cited

U.S. PATENT DOCUMENTS

| | | | | |
|---|---|---|---|---|
| 2008/0062762 | A1* | 3/2008 | Doyle | G11C 11/5642 365/185.11 |
| 2009/0109743 | A1* | 4/2009 | Goda | G11C 16/0483 365/185.2 |
| 2011/0188283 | A1* | 8/2011 | Chevallier | G11C 8/12 977/755 |
| 2021/0249595 | A1* | 8/2021 | Itoh | H10N 70/8833 |
| 2021/0375344 | A1* | 12/2021 | Young | G11C 11/2275 |

(Continued)

*Primary Examiner* — Hien N Nguyen
(74) *Attorney, Agent, or Firm* — JCIPRNET

(57) ABSTRACT

A memory circuit and a method for reading a memory circuit are provided. The memory circuit includes reference memory cells and operation memory cells. The method includes reading a selected reference memory cell at a first time to get a first voltage; reading the selected reference memory cell at a second time after the first time to get a second voltage; adjusting a read voltage of the memory cell to be an adjusted read voltage of the memory cell according to the voltage difference between the first voltage and the second voltage; applying the adjusted read voltage on a selected operation memory cell corresponding to the selected reference memory cell; and applying the adjusted read voltage on other selected operation memory cells in a same row of the memory array corresponding to the selected reference memory cell. The time difference between the first time and the second time is within a range smaller than a predetermined time difference according to characteristics of a corresponding selector in the selected reference memory cell or the selected operation memory cell.

20 Claims, 14 Drawing Sheets

(56) References Cited

U.S. PATENT DOCUMENTS

2022/0230680 A1* 7/2022 Wu .......................... G11C 7/04
2023/0162774 A1* 5/2023 Young ................. G11C 11/2259
　　　　　　　　　　　　　　　　　　　365/145

* cited by examiner

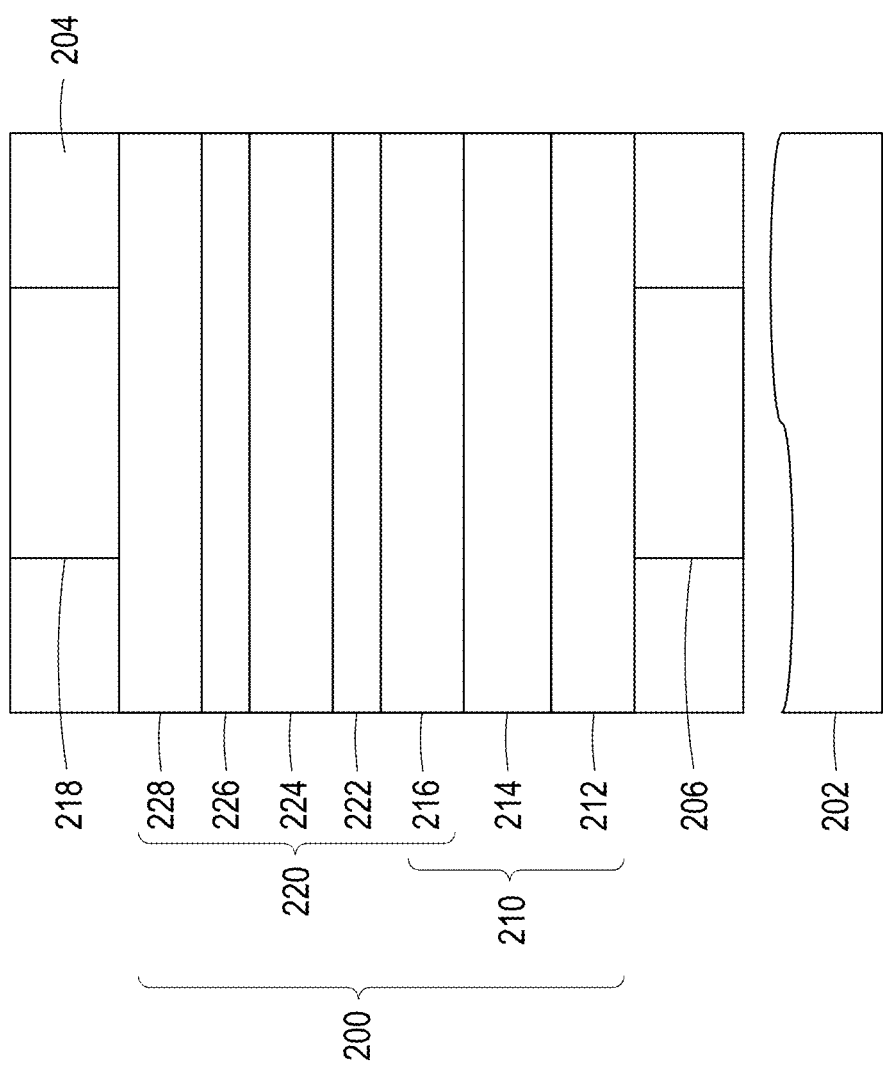

MEMORY CIRCUIT AND METHOD FOR READING MEMORY CIRCUIT

CROSS-REFERENCE TO RELATED APPLICATION

This application claims the priority benefit of U.S. provisional application Ser. No. 63/419,711, filed on Oct. 27, 2022. The entirety of the above-mentioned patent application is hereby incorporated by reference herein and made a part of this specification.

BACKGROUND

In integrated circuit (IC) devices, resistive random-access memory (RRAM) is a technology for non-volatile memory devices. Generally, RRAM use a dielectric material, which although normally insulating, can be made to conduct through a filament or conduction path formed after the application of a specific voltage. Once the filament is formed, it may be set (i.e., re-formed, resulting in a lower resistance across the RRAM) or reset (i.e., broken, resulting in a high resistance across the RRAM) by applying appropriate voltages. The low and high resistance states can be utilized to indicate a digital signal of "1" or "0" depending upon the resistance state, and thereby provide a non-volatile memory cell that can store a bit.

With the rapid development of electronic technology, light, thin and small electronic products are the mainstream of market, and memory stacking for storage technology is becoming important. From an application point of view, RRAM cross-point arrays provide higher density of storage capacity by stacking technology and are CMOS compatible in the back-end process, which result in a reduction of the manufacturing complexity and cost in comparison with other non-volatile memory structures. Despite the attractive properties noted above, a number of challenges exist.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2B illustrates a cross-sectional view of some embodiments of a memory cell with one selector one resistor (1S1R) structures.

DETAILED DESCRIPTION

Figure 1A:
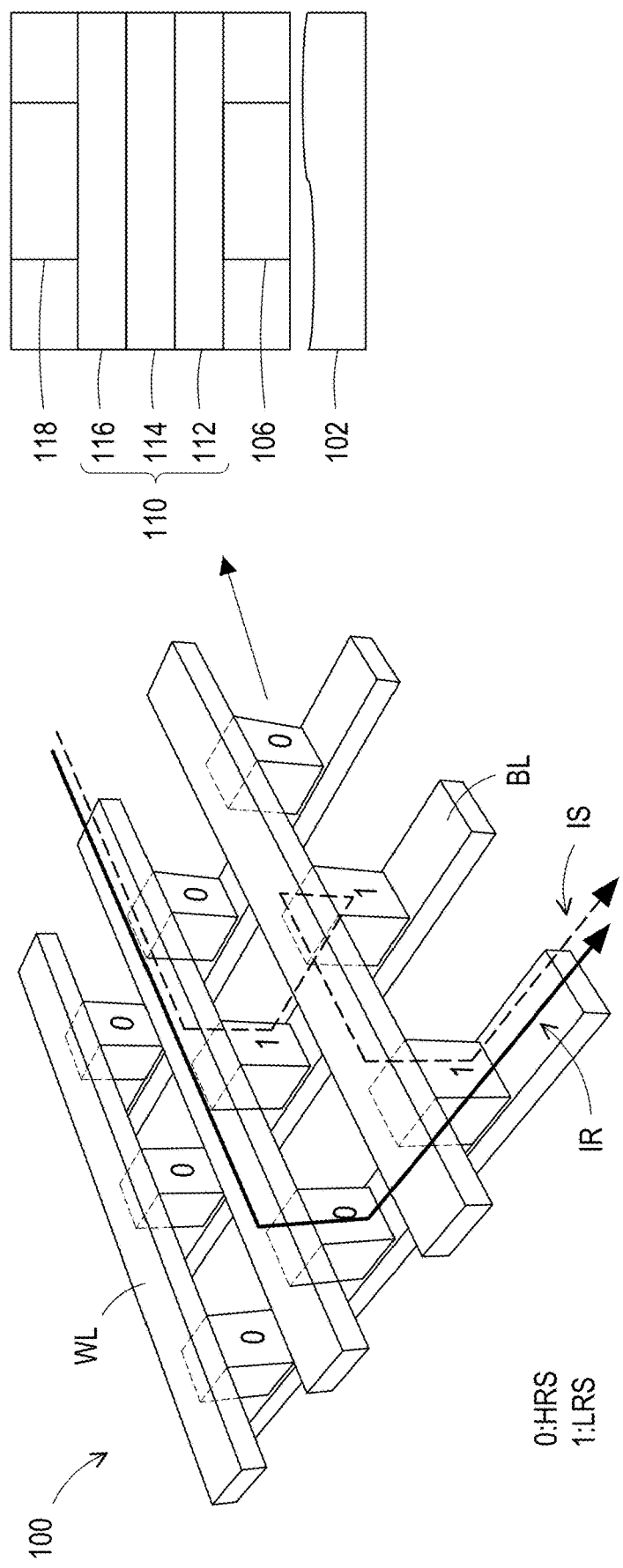
FIG. 1A shows an exemplary scheme of 3D crossbar memory array architecture without selector structures.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

FIG. 1A shows an exemplary scheme of 3D crossbar memory array architecture without selector structures.

Referring to FIG. 1A, a memory array 100 includes a plurality of memory cells 110, a plurality of word lines WL, and a plurality of bit lines BL. In some embodiments, the memory cell 110 is surrounded by an inter-level dielectric (ILD) structure (not shown) arranged over a substrate 102. The substrate 102 may be any type of semiconductor body such as a semiconductor wafer and/or one or more die on a wafer, as well as any other type of semiconductor and/or epitaxial layers, associated therewith. The semiconductor body may include silicon, SiGe, SOI, or the like. The ILD structure may be a single layered or multiple layered structure, and include silicon oxide (SiO$_2$), silicon oxynitride (SiON), silicon nitride (SiN), silicon carbide (SiC), or the like.

The memory cell 110 includes a first electrode 112, a dielectric data storage layer 114, and a second electrode 116. The first electrode 112 is separated from the substrate 102 by one or more first interconnect layers 106. The first interconnect layer 106 may be a metal via and/or a metal wire. In some embodiments, the first interconnect layer 106 is electrically coupled to underlying electric components, such as a transistor, a resistor, a capacitor, a selector, and/or a diode. The dielectric data storage layer 114 is arranged over the first electrode 112, and the second electrode 116 is disposed between the dielectric data storage layer 114 and a second interconnect layer 118. The second interconnect layer 118 may be a metal via and/or a metal wire.

In some embodiments, the memory cell 110 is a resistive random-access memory (RRAM) cell and is configured to store data by a resistance of the dielectric data storage layer 114. In some embodiments, the dielectric data storage layer 114 having a variable resistance is configured to store data states by undergoing reversible changes between a high resistance state associated with a first data state (e.g., a '0') and a low resistance state associated with a second data state (e.g., a '1'). For example, to achieve a low resistance state within the dielectric data storage layer 114, a first set of bias conditions may be applied to the first electrode 112 and the second electrode 116. The first set of bias conditions drive oxygen from dielectric data storage layer 114 to the second electrode 116, thereby forming conductive filaments of oxygen vacancies across the dielectric data storage layer 114. Alternatively, to achieve a high resistance state within the dielectric data storage layer 114, a second set of bias conditions may be applied to the first electrode 112 and the second electrode 116. The second set of bias conditions break the conductive filaments by driving oxygen from the second electrode 116 to the dielectric data storage layer 114.

In some alternative embodiments, the dielectric data storage layer 114 is replaced with some other suitable data storage structure, such that the memory cell 110 is another type of memory cell. For example, the memory cell 110 may be a phase change memory (PCM) cell, a magnetoresistive random-access memory (MRAM) cell, a conductive-bridging random-access memory (CBRAM) cell, or some other suitable memory cell.

In some embodiments, the first electrode 112 may be or include titanium nitride (TiN), titanium tungsten (TiW), titanium tungsten nitride (TiWN), titanium tantalum nitride (TiTaN), tantalum nitride (TaN), tungsten (W), tungsten nitride (WN), hafnium nitride (HfN), tungsten titanium (WTi), tungsten titanium nitride (WTiN), hafnium tungsten nitride (HfWN), hafnium tungsten (HfW), titanium hafnium nitride (TiHfN), or the like. In some embodiments, the second electrode 116 may be or include titanium nitride (TiN), titanium tungsten (TiW), titanium tungsten nitride (TiWN), titanium tantalum nitride (TiTaN), tantalum nitride (TaN), tungsten (W), tungsten nitride (WN), hafnium nitride (HfN), tungsten titanium (WTi), tungsten titanium nitride (WTiN), hafnium tungsten nitride (HfWN), hafnium tungsten (HfW), titanium hafnium nitride (TiHfN), or the like. In some embodiments, the second electrode 116 and the first electrode 112 are the same material. In some alternative embodiments, the second electrode 116 and the first electrode 112 have different materials.

The schematic illustration of sneak current in 3D crossbar memory array during read operation is shown in FIG. 1A. In FIG. 1A, "0" stands for off-state, while "1" stands for on-state. In other words, "0" stands for the high resistance state (HRS) of the memory cell 110, while "1" stands for the low resistance state (LRS) of the memory cell 110. The presence of sneak current IS is one of the most critical issues in crossbar memory array architecture due to the extremely parallel geometry. The sneak current IS flowing through the on-state (mark "1") neighboring memory cells (dashed-line path) could disturb the read current IR from the target cell (line path). When the array size is getting larger, the leakage issue is getting even worse. Large sneak currents IS would increase total power consumption. In view of this, introducing a selector in series with memory cell is an essential solution for the sneak current problem.

Figure 1B:
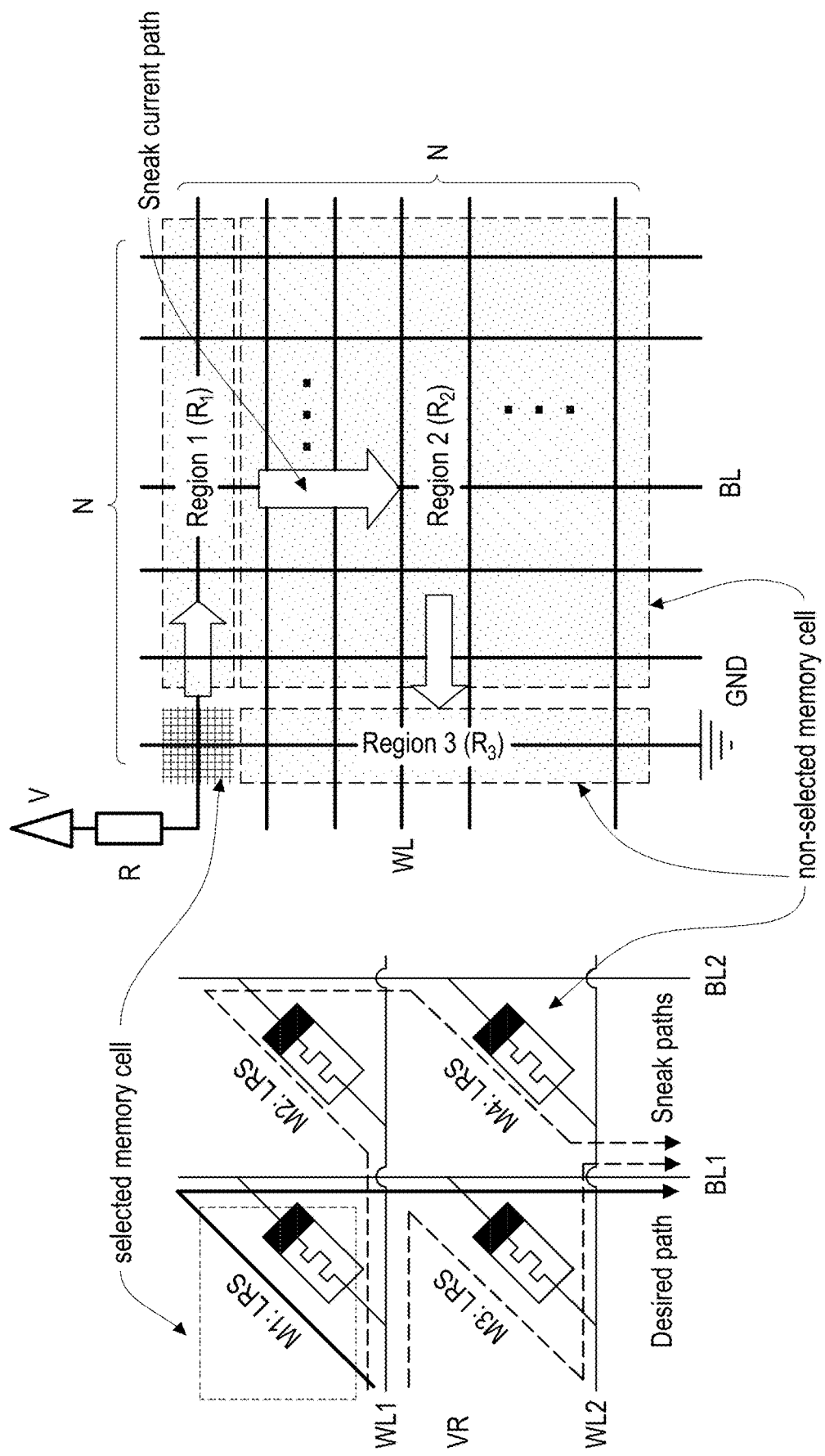
FIG. 1B shows an exemplary scheme of the sneak path current in a 2×2 and N×N crossbar memory array.

FIG. 1B shows an exemplary scheme of the sneak path in a 2×2 and N×N crossbar memory array.

The crossbar memory array is able to be used in three-dimensional stacking technology to achieve high density and ultra-high capacity memory with a minimum area of 4F$^2$ (F: feature size) for a single memory cell. However, because of the crosstalk effect caused by the non-ideal sneak current through the sneak path, the external read circuit may misjudge the memory resistance state of the memory cell.

FIG. 1B illustrates the memory circuit of an N×N crossbar (or interleaved) memory array during read process. Considering a one bit line pull-up read scheme, in the scenario of read interference where all unselected cells are in LRS. When the pull-up voltage V and pull-up resistance R of the external circuit are applied to the memory cell, the memory cells may provide a sneak path to the ground. That is, the sneak current may flow through the unselected cells, represented by the three main blocks of the first region 1 ($R_1$), the second region 2 ($R_2$), and the third region 3 ($R_3$), which leads to read error when the selected cell is in HRS. The first region 1 ($R_1$) refers to the region on the same bit line BL as the selected cell. The third region 3 ($R_3$) refers to the region of the same word line WL as the selected cell. The second region 2 ($R_2$) refers to other regions. The read voltage will also across the series regions, and the current read by the external circuit is not only the original read current but also considering the sneak current caused by the sneak path.

Referring to FIG. 1B, the sneak path in a 2×2 crossbar memristor (or RRAM) array is illustrated. During read operation, the sneak current (flowing through dashed-line path) problem is most significant when the unselected memory cells M2, M3 and M4 in FIG. 1B are in the low resistance state (LRS) while the selected memory cell M1 is in the high resistance state (HRS). That is, since the sneak current follows the least resistive path, the contribution of the unselected devices current will result in decreasing of the noise margin, leading to incorrect reading of the memory state.

There are many proposed solutions that aim to minimize the sneak current. The solutions can be divided into two main categories: device level and circuit level. For example, in an auxiliary biasing voltage, a sequence of access patterns is optimized to reduce the impact of the sneak current on the functionality. For example, a read voltage pulse VR is applied at WL1 while BL1 is biased to the ground voltage GND to minimize the sneak current. Another approach is to integrate a selector element with each memory cell in the memory array, where the selector component can be a non-linear element (such as transistor, diode or memristor) that passes the current only when the voltage applied across the memory cell exceeds a threshold value, hence, reducing the sneak currents from affecting other memory cells.

Figure 2A:
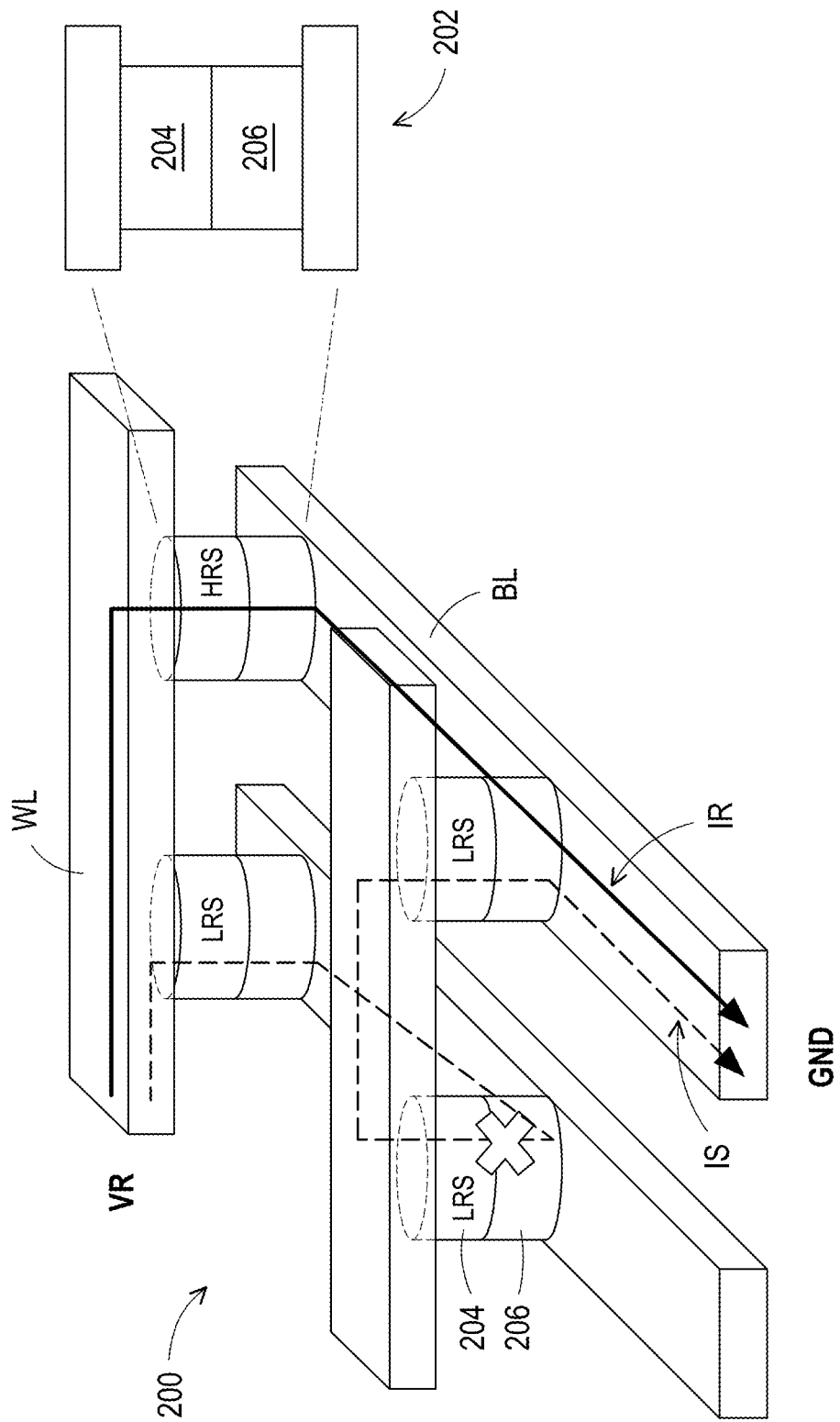
FIG. 2A shows an exemplary scheme of 3D crossbar memory array architecture with one selector one resistor (1S1R) structures.

FIG. 2A shows an exemplary scheme of 3D crossbar memory array architecture with one-selector-one-resistor (1S1R) structures.

Referring to FIG. 2A, the 3D crossbar memory array 200 includes word lines WL, bit lines BL, and the plurality of memory cells. The memory cell includes a memory device 204 and a selector 206, meaning the memory cell 202 is a one-selector-one-resistor (1S1R) structure. In FIG. 2A, the selector-embedded 1S1R array is illustrated for suppressing the sneak current IS, thus providing the non-disturbed read current IR flowing through the selected memory cell 202 from the word line WL to the bit line BL. The memory device 204 of the selected memory cell 202 is in HRS during the read process.

FIG. 2B illustrates a cross-sectional view of some embodiments of a memory cell with one-selector-one-resistor (1S1R) structures.

Referring to FIG. 2B, a memory cell 200 includes a memory device 210 and a selector 220. In some embodiments, the memory device 210 is surrounded by an inter-level dielectric (ILD) structure 204 arranged over a substrate 202. The substrate 202 may be any type of semiconductor body such as a semiconductor wafer and/or one or more die on a wafer, as well as any other type of semiconductor and/or epitaxial layers, associated therewith. The semiconductor body may include silicon, SiGe, SOI, or the like. The ILD structure may be a single layered or multiple layered structure, and include silicon oxide ($SiO_2$), silicon oxynitride (SiON), silicon nitride (SiN), silicon carbide (SiC), or the like.

The memory device 210 includes a first electrode 212, a dielectric data storage layer 214, and a second electrode 216. The first electrode 212 is separated from the substrate 202 by one or more first interconnect layers 206. The first interconnect layer 206 may be a metal via and/or a metal wire. In some embodiments, the first interconnect layer 206 is electrically coupled to underlying electric components, such as a transistor, a resistor, a capacitor, a selector, and/or a diode. The dielectric data storage layer 214 is arranged over the first electrode 212, and the second electrode 216 is disposed between the dielectric data storage layer 214 and a second interconnect layer 218. The second interconnect layer 218 may be a metal via and/or a metal wire.

In some embodiments, the memory device 210 is an RRAM cell and is configured to store data by a resistance of the dielectric data storage layer 214. In some embodiments, the dielectric data storage layer 214 having a variable resistance is configured to store data states by undergoing reversible changes between a high resistance state associated with a first data state (e.g., a '0') and a low resistance state associated with a second data state (e.g., a '1'). For example, to achieve a low resistance state within the dielectric data storage layer 214, a first set of bias conditions may be applied to the first electrode 212 and the second electrode 216. The first set of bias conditions drive oxygen from dielectric data storage layer 214 to the second electrode 216, thereby forming conductive filaments of oxygen vacancies across the dielectric data storage layer 214. Alternatively, to achieve a high resistance state within the dielectric data storage layer 214, a second set of bias conditions may be applied to the first electrode 212 and the second electrode 216. The second set of bias conditions break the conductive filaments by driving oxygen from the second electrode 216 to the dielectric data storage layer 214.

In some alternative embodiments, the dielectric data storage layer 214 is replaced with some other suitable data storage structure, such that the memory device 210 is another type of memory cell. For example, the memory device 210 may be a phase PCM cell, a MRAM cell, a CBRAM cell, or some other suitable memory cell.

In some embodiments, the first electrode 212 may be or include titanium nitride (TiN), titanium tungsten (TiW), titanium tungsten nitride (TiWN), titanium tantalum nitride (TiTaN), tantalum nitride (TaN), tungsten (W), tungsten nitride (WN), hafnium nitride (HfN), tungsten titanium (WTi), tungsten titanium nitride (WTiN), hafnium tungsten nitride (HfWN), hafnium tungsten (HfW), titanium hafnium nitride (TiHfN), or the like. In some embodiments, the second electrode 216 may be or include titanium nitride (TiN), titanium tungsten (TiW), titanium tungsten nitride (TiWN), titanium tantalum nitride (TiTaN), tantalum nitride (TaN), tungsten (W), tungsten nitride (WN), hafnium nitride (HfN), tungsten titanium (WTi), tungsten titanium nitride (WTiN), hafnium tungsten nitride (HfWN), hafnium tungsten (HfW), titanium hafnium nitride (TiHfN), or the like. In some embodiments, the second electrode 216 and the first electrode 212 are the same material. In some alternative embodiments, the second electrode 216 and the first electrode 212 have different materials.

The selector 220 overlies the memory device 210. In some embodiments, the selector 220 and the memory device 210 form a 1S1R stack. The selector 220 includes the second electrode 216, a first work function metal layer 222, a selector layer 224, a second work function metal layer 226 and a third electrode 228. The selector layer 224 is disposed over the second electrode 216, and the third electrode 228 is disposed between the selector layer 224 and the second interconnect layer 218. The second interconnect layer 218 is disposed over and electrically coupled to the third electrode 228. The second interconnect layer 218 is electrically coupled to overlying metal wires.

The selector layer 224 is configured to switch between a low resistance state and a high resistance state depending on whether a voltage applied across the selector 220 is greater than a threshold voltage. In some embodiments, the selector 220 may be a threshold-type selector. For example, the selector 220 may have a high resistance state if a voltage across the selector 220 is less than the threshold voltage, and the selector 220 may have a low resistance state if a voltage across the selector 220 is greater than the threshold voltage. In some embodiments, an electron affinity (i.e., the energy from vacuum level to conduction band) of the selector layer 224 is in a range of about 3.5 eV to about 4.5 eV. The selector layer 224 may include a chalcogenide material such as CdS, $Ce_2S_3$, $CuInS_2$, $CuIn_5S_8$, $In_2S_3$, PbS, $Sb_2S_3$, ZnS, CdSe, CdTe, $Sb_2Se_3$, a combination thereof or the like. In some embodiments, the selector layer 224 includes an ovonic threshold switch (OTS) material or a voltage conductive bridge (VCB) material. The OTS material may include a binary material such as SiTe, GeTe, CTe, BTe, ZnTe, AlTe, GeSe, GeSb, SeSb, SiAs, GeAs, AsTe and BC, a ternary material such as GeSeAs, GeSeSb, GeSbTe, GeSiAs, GeAsSb, SeSbTe and SiTeSe, or a quadruple material such as GeSeAsTe, GeSeTeSi, GeSeTeAs, GeTeSiAs, GeSeAsSb and GeSeSbSi. The binary material may be doped with N, O or the like, and the ternary material and the quadruple material may be doped with N, O, C or the like. The VCB material may include at least one metal and at least one oxide, the at least one metal may be selected from Ag, Cu, Al, As, Te and the like, and the oxide may be $SiO_2$, $TiO_2$, $Al_2O_3$, $TaO_2$, $ZrO_2$, a combination thereof or the like.

In some embodiments, the third electrode 228 may be or include titanium nitride (TiN), titanium tungsten (TiW), titanium tungsten nitride (TiWN), titanium tantalum nitride (TiTaN), tantalum nitride (TaN), tungsten (W), tungsten nitride (WN), hafnium nitride (HfN), tungsten titanium (WTi), tungsten titanium nitride (WTiN), hafnium tungsten nitride (HfWN), hafnium tungsten (HfW), titanium hafnium nitride (TiHfN), or the like. In some embodiments, the third electrode 228 and the second electrode 216 are the same material. In some alternative embodiments, the third electrode 228 and the second electrode 216 have different materials.

In some embodiments, the first work function metal layer 222 is disposed between the selector layer 224 and the second electrode 216, and the second work function metal layer 226 is disposed between the selector layer 224 and the third electrode 228. In some embodiments, the first work function metal layer 222 is directly disposed on the selector layer 224, that is, the first work function metal layer 222 is in direct contact with the selector layer 224. Similarly, the second work function metal layer 226 is directly disposed under the selector layer 224, and the second work function metal layer 226 is in direct contact with the selector layer 224. The material of the first work function metal layer 222 and the second work function metal layer 226 is selected based on a material of the selector layer 224. In some embodiments, the first work function metal layer 222 and the second work function metal layer 226 may include Al, Mn, Zr, Bi, Pb, Ta, Ag, V, Zn, Ti, Nb, Sn, W, Cr, Fe, TiN, Mo, Cu, Ru, Sb, Os, Te, Re, Rh, Be, Co, TiN, TaN, Ta/Si/N, Ti/Si/N, Au, Pd, Ni, Pt or a combination thereof.

In some alternative embodiments, in the memory cell 200, the work function metal layer (e.g., the first work function metal layer 222 or the second work function metal layer 226) is disposed at only one side of the selector layer 224 (not shown). In other words, the selector 220 has a unipolar element. In addition, in above embodiments, the memory device 210 is disposed under the selector 220. However, the disclosure is not limited thereto. In some alternative embodiments, the memory device 210 is disposed above the selector 220. For example, the selector 220 is disposed between the memory device 210 and the first interconnect layer 206, and the selector 220 is electrically coupled to the first interconnect layer 206. The memory device 210 may be disposed between the second interconnect layer 218 and the selector 220, and the memory device 210 may be electrically coupled to the second interconnect layer 218.

In some embodiments, a thickness of the selector layer 224 is larger than a thickness of the first work function metal layer 222 and the second work function metal layer 226. A thickness of the selector layer 224 may be in a range of about 10 nm to about 50 nm, and a thickness of the first work function metal layer 222 and the second work function metal layer 226 may be in a range of about 1 nm to about 5 nm. In some embodiments, the first work function metal layer 222 and the second work function metal layer 226 may be respectively a single layer. However, the disclosure is not limited thereto. In some alternative embodiments, at least one of the first work function metal layer 222 and the second work function metal layer 226 may be a multiple layered structure. That is, the first work function metal layer 222 and/or the second work function metal layer 226 may include a plurality of layers. In the multiple layered structure of the work function metal layer, a work function of the layer may increase as the layer becomes closer to the selector layer 224, and a thickness of the layer may decrease as the layer becomes closer to the selector layer 224. In some embodiments, the first work function metal layer 222 and the second work function metal layer 226 are disposed on opposite sides of the selector layer 224, in other words, the selector 220 has a bi-polar element. However, the disclosure is not limited thereto.

In some embodiments, the widths of the first electrode 212, the dielectric data storage layer 214, the second electrode 216, the first work function metal layer 222, the first barrier layer 223, the selector layer 224, the second barrier layer 225, the second work function metal layer 226 and the third electrode layer 228 are substantially the same. However, the disclosure is not limited thereto. In some alternative embodiments, the widths of the first electrode 212, the dielectric data storage layer 214, the second electrode 216, the first work function metal layer 222, the first barrier layer 223, the selector layer 224, the second barrier layer 225, the second work function metal layer 226 and the third electrode layer 228 may be different.

In some embodiments, a word line or a word plane extending along a first direction is electrically coupled to one end of the memory device, and a bit line BL extending along a second direction substantially perpendicular to the first direction is electrically coupled to an opposite end of the memory device. Consequently, by providing suitable bias conditions, the memory cell can be switched between two states of electrical resistance, a first state with a low resistance and a second state with a high resistance, to store data.

It is known that the threshold-type selector blocks the off-state current by its thickness and a barrier height. However, for aggressive scaled memory array, the total thickness of the selector should be reduced, which will increase the off-state current too much. In some embodiments, the work function metal layer is disposed between the selector layer and the electrode of the selector. The work function metal layer is configured to provide certain work function with respect to the electron affinity of the selector layer. Therefore, when the selector is turned on, carriers go through the work function metal layer by FN (Fowler Nordheim) tunneling, which will not increase the on-state resistance of the selector significantly. Accordingly, performance such as stability and reliability of the memory device may be improved by reducing the subthreshold leakage of the selector and thereby reducing the off-state current of the memory cell.

In some embodiments, the barrier layer is disposed between the selector layer and the work function metal layer of the selector. The barrier layer is configured to provide certain conduction band with respect to the electron affinity of the selector layer. Therefore, when the selector is turned on, carriers go through the barrier layer by FN tunneling, which will not increase the on-state resistance of the selector significantly. Accordingly, performance such as stability and reliability of the memory device may be improved by reducing the subthreshold leakage of the selector and thereby reducing the off-state current of the memory cell.

In some embodiments, a first electrode film, a second electrode film, a work function metal film, a selector film, and the above layers may be formed using a deposition process such as, for example, CVD, PVD, PE-CVD, sputtering, ALD, some other suitable deposition process(es), or any combination of the foregoing. In some alternative embodiments, in the method of forming the memory device, at least one of the work function metal film and the barrier film may be omitted.

Figure 3B:
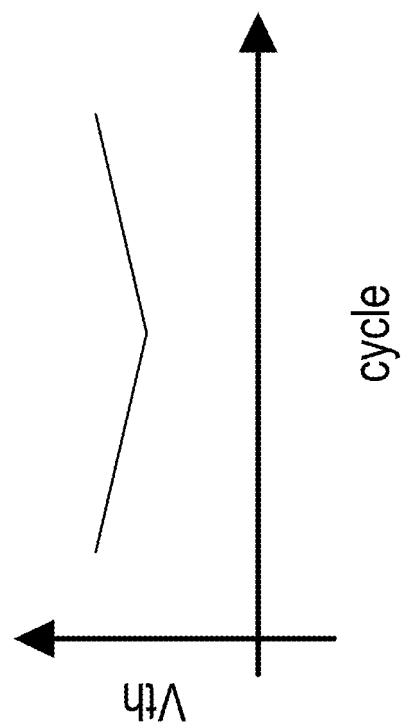
FIG. 3A and FIG. 3B respectively illustrates the threshold voltage varying with the time and the read cycle of a memory device.
Figure 3A:
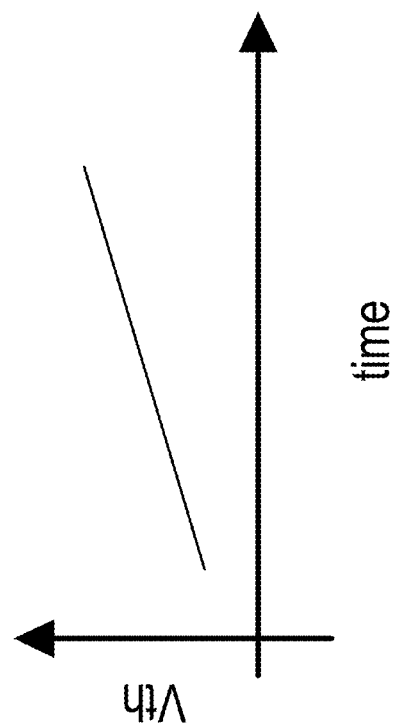
Figure 3C:
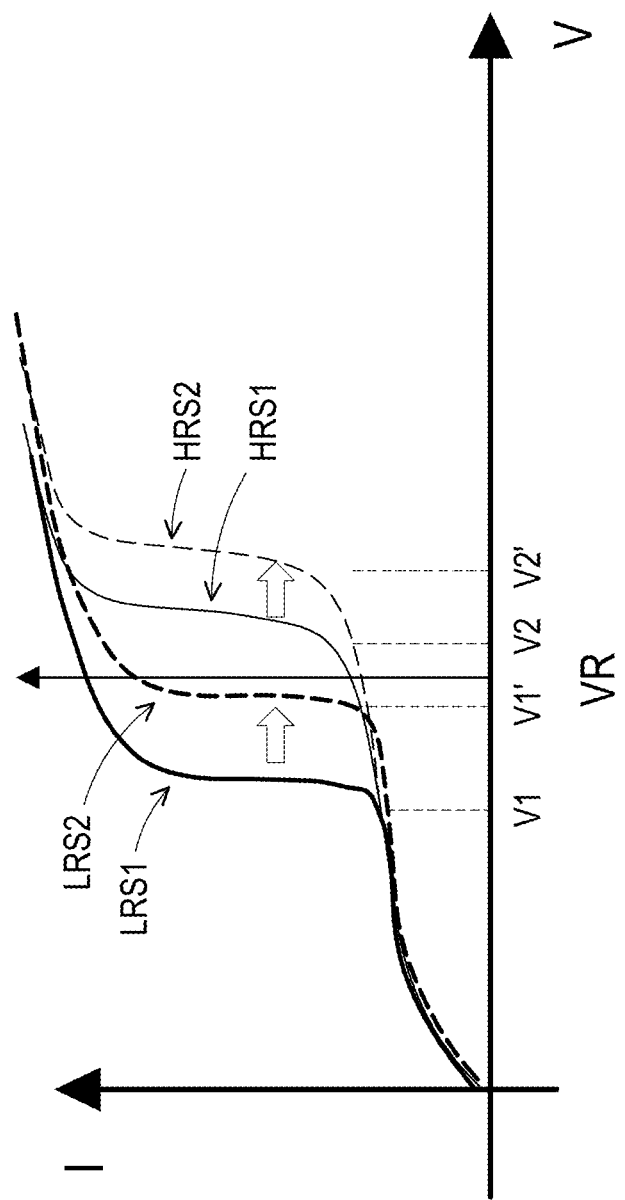
FIG. 3C illustrates an I-V curve of the memory cell varying with the time.

FIG. 3A and FIG. 3B respectively illustrates the threshold voltage varying with the time and the read cycle of a memory device. FIG. 3C illustrates an I-V curve of the memory cell varying with the time.

In order to suppress a sneak current, the selector is added in series with the memory device, constituting an 1S1R structure. Threshold switching (TS) selectors based on metal filament have attracted much attention due to its large ON/OFF ratio, low leakage current, and compatibility with CMOS process. As an important part of 1S1R structure, selector parameters have great effects on 1S1R array performance. The impact of the selector characteristics on the performance of 1S1R memory array cannot be ignored. In fact, because of the non-uniformity existing in filament setup process, the characteristics of the selector may have a large variation. For example, the threshold voltage (Vth) has a non-negligible variation in the range of hundreds of mV over time. The variation in TS selectors potentially introduces serious problems to the read operation of the memory array, such as the increase in power consumption and high bit error rate (BER).

Referring to FIG. 3A and FIG. 3B, the threshold voltage of the selector is unstable and will change over time after the selector is turned on. For example, the threshold voltage versus time in log scale shows a linear slope. In addition, the threshold voltage of the selector degrades and varies with the reading cycle as well. In some embodiments, the degradation trend depends on materials, the I-V curve shown in FIG. 3B is one of the situations. Since the threshold voltage of the selector shifts a lot in a very short period of time (less than 1 second), it is noted to be careful when reading memory cells. Also, each time when the memory cell is read, it needs to be completed within a very short time to avoid being influenced by the effect of threshold voltage shift. In other words, if the same read voltage is still used to read the memory cell, the memory cell will not be operated in the correct state, thus leading to mis-operation.

Referring to FIG. 3C, a size of the voltage memory window (VMW) barely changes with the increase of threshold voltage variation. However, the turn-on voltage of the selector and the turn-on voltage of the memory cell (i.e., the turn-on voltage of the selector plus the turn-on voltage of the memory device) will shift right in positive read (or positive scan) process. In the meantime, the applied voltage, needed to turn on the selector, increases with the rising variation of the selector's threshold voltage.

When the positive scan voltage is greater than the set voltage V2 of the 1S1R memory cell, the selector turns on, the memory device (i.e., RRAM, MRAM, PCRAM) changes from high resistance state HRS1 to low resistance state LRS1, and the integrated 1S1R memory cell (including the memory device and the selector) changes to low resistance state as well. As such, when the read voltage VR, which is larger than the turn-on voltage V1 of 1S1R memory cell and lower than the set voltage V2 of 1S1R memory cell, is used in the positive read (or scan) direction, the memory information of the device can be obtained without damaging the memory state of the memory cell. In some embodiments, the read voltage VR is substantially about one-half of the sum of the turn-on voltage V1 of 1S1R memory cell and the set voltage V2 of 1S1R memory cell. However, the disclosure is not limited thereto. The voltage on the unselected 1S1R memory cell in the crossbar memory array is half of the read voltage VR (i.e., ½ read voltage or ½ VR). Therefore, the current flowing through the unselected 1S1R memory cell is quite small, so the sneak current effect is able to be effectively avoided.

When the reversed positive scan voltage is less than the turn-on voltage V1 of the selector (or roughly less than the turn-on voltage of the 1S1R memory cell), the selector turns off. Even though the memory device is in low resistance state LRS1, the integrated 1S1R memory cell is in high resistance state HRS1 because the selector is closed.

In some embodiments, the turn-on voltage V1 of the memory cell is a voltage of the memory device in high resistance state HRS1. In some embodiments, the turn-on voltage V1 of the memory cell is larger than a turn-on voltage of the selector. In some embodiments, the read voltage VR of the 1S1R memory cell is substantially half of the sum of the set voltage V2 of the memory cell and the turn-on voltage V1 of the memory cell.

However, since the threshold voltage of the selector varies with time, the turn-on voltage of the 1S1R memory cell (or the turn-on voltage of the selector) and the set voltage of the 1S1R memory cell will also change accordingly. As can be seen in FIG. 3C, the shifted turn-on voltage V1' of the 1S1R memory cell and the shifted set voltage V2' of the 1S1R memory cell have shifted to the right relative to the original turn-on voltage V1 of the selector (or roughly less than the turn-on voltage of the 1S1R memory cell) and the original set voltage V2 of 1S1R memory cell in a short period of time (less than 1 second). Therefore, when the shifted turn-on voltage V1' of the 1S1R memory cell is larger than the original read voltage VR, the 1S1R memory cell cannot be turned on with the same read voltage VR. In this case, a read error will occur. In other words, a small current will be read, which means that the 1S1R memory cell is in a high resistance state HRS2, not in the expected low resistance state LRS2; therefore, the correct memory information is not able to be acquired. Therefore, it is necessary to set the proper read voltage VR to ensure that the memory information is read correctly.

Similarly, when the absolute value of the negative scan voltage is greater than the negative turn-on voltage of the selector (not shown), the selector turns on. In this period of time, the memory device is still in low resistance state, so the read current is quite large. When the negative scan voltage further increases and is higher than the turn-on voltage of 1S1R memory cell, the memory device resets and changes from low resistance state to high resistance state, thus leading to small read current. When the absolute value of reversed negative scan voltage is less than the negative hold voltage of the selector, the selector is turned off. In the meantime, the 1S1R memory cell is in a high resistance state. As such, when the read voltage, which is larger than the turn-on voltage of 1S1R memory cell and lower than the reset voltage of 1S1R memory cell, is used in the negative read (or scan) direction, the memory information of the device can be obtained without damaging the memory state of the memory cell. In some embodiments, the read voltage is substantially about one-half of the sum of the turn-on voltage of 1S1R memory cell and the reset voltage of 1S1R memory cell. However, the disclosure is not limited thereto. The absolute voltage value on the unselected 1S1R memory cell in the crossbar memory array is half of the read voltage (i.e., ½ read voltage). Therefore, the current flowing through the unselected 1S1R memory cell is quite small, so the sneak current effect is able to be effectively avoided.

Figure 4:
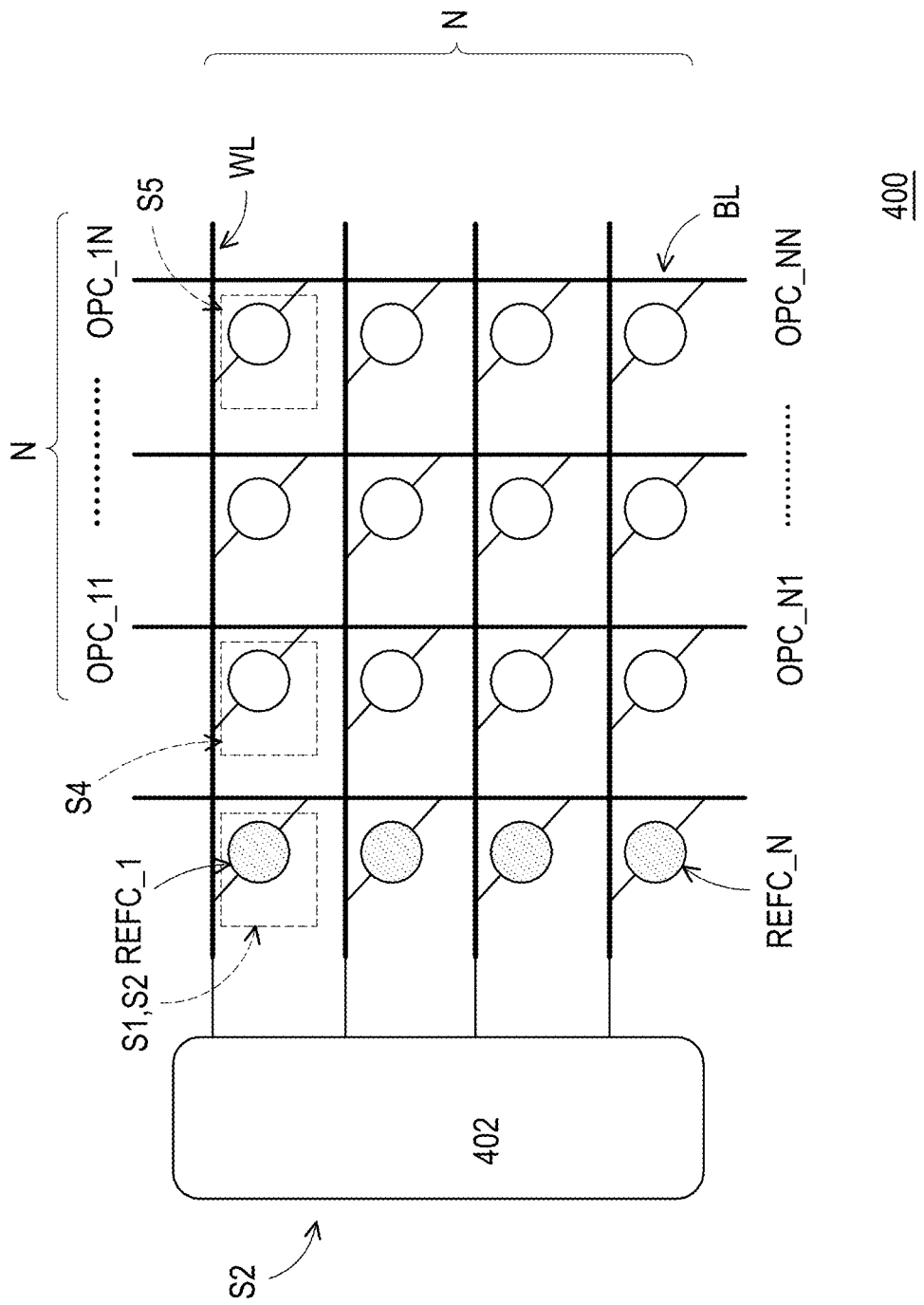
FIG. 4 shows an exemplary scheme of the memory circuit architecture during the read process with the reference memory cells and the operation memory cells.

FIG. 4 shows an exemplary scheme of the memory circuit architecture during the read process with the reference memory cells and the operation memory cells.

Referring to FIG. 4, the memory circuit 400 includes word lines WL, bit lines BL, an N×N memory array, a 1×N reference array, and a read circuit 402. The 1×N reference array incudes a plurality of reference memory cells REFC_1, ..., REFC_N, and the N×N memory array includes a plurality of operation memory cells OPC_11, ..., OPC_NN.

In an embodiment of the present disclosure, the plurality of reference memory cells REFC_1, ..., REFC_N and the plurality of operation memory cells OPC_11, ..., OPC_NN are the same type of the 1S1R memory cell. That is, the type of memory devices in the plurality of reference memory cells REFC_1, ..., REFC_N and the plurality of operation memory cells OPC_11, ..., OPC_NN can be either one of the MRAM, RRAM, or PCRAM, however, the disclosure is not limited thereto. In some embodiments, each of the reference memory cells REFC_1, ..., REFC_N is electrically connected to the bit line BL, the word line WL, and the read circuit 402. In some embodiments, each of the reference memory cells REFC_1, ..., REFC_N is connected to the same bit line BL. It is noted that the plurality of reference memory cells REFC_1, ..., REFC_N are additionally placed memory cells, thus a total bit number in each row is N+1, wherein N is a positive integer. For example, when the size of memory array is 4×5, it means that the size of the operation memory cells is 4×4 (i.e., 16 operation memory cells), and the other 4 reference memory cells are in the same column. In some embodiments, the plurality of reference memory cells REFC_1, ..., REFC_N are placed in different columns.

In an embodiment of the present disclosure, each row of the memory array comprises at least one reference memory cell REFC_1, ..., REFC_N, and each of the reference memory cells REFC_1, ..., REFC_N corresponds to at least one operation cell in the same row of the memory array.

In an embodiment of the present disclosure, each of the operation memory cells REFC_1, ..., REFC_N includes a memory device (i.e., RRAM, MRAM, PCRAM, however, the disclosure is not limited thereto) and a selector electrically coupled to the memory device. In some embodiments, each of the operation memory cells REFC_1, ..., REFC_N is read in either a low resistance state or a high resistance state. In some embodiments, each of the reference memory cells REFC_1, ..., REFC_N includes only one selector electrically coupled to the memory array. In some embodiments, each of the reference memory cells REFC_1, ..., REFC_N includes a memory device and a selector electrically coupled to the memory device, and wherein each of the operation memory cells OPC_11, ..., OPC_NN is read in a low resistance state.

Figure 5:
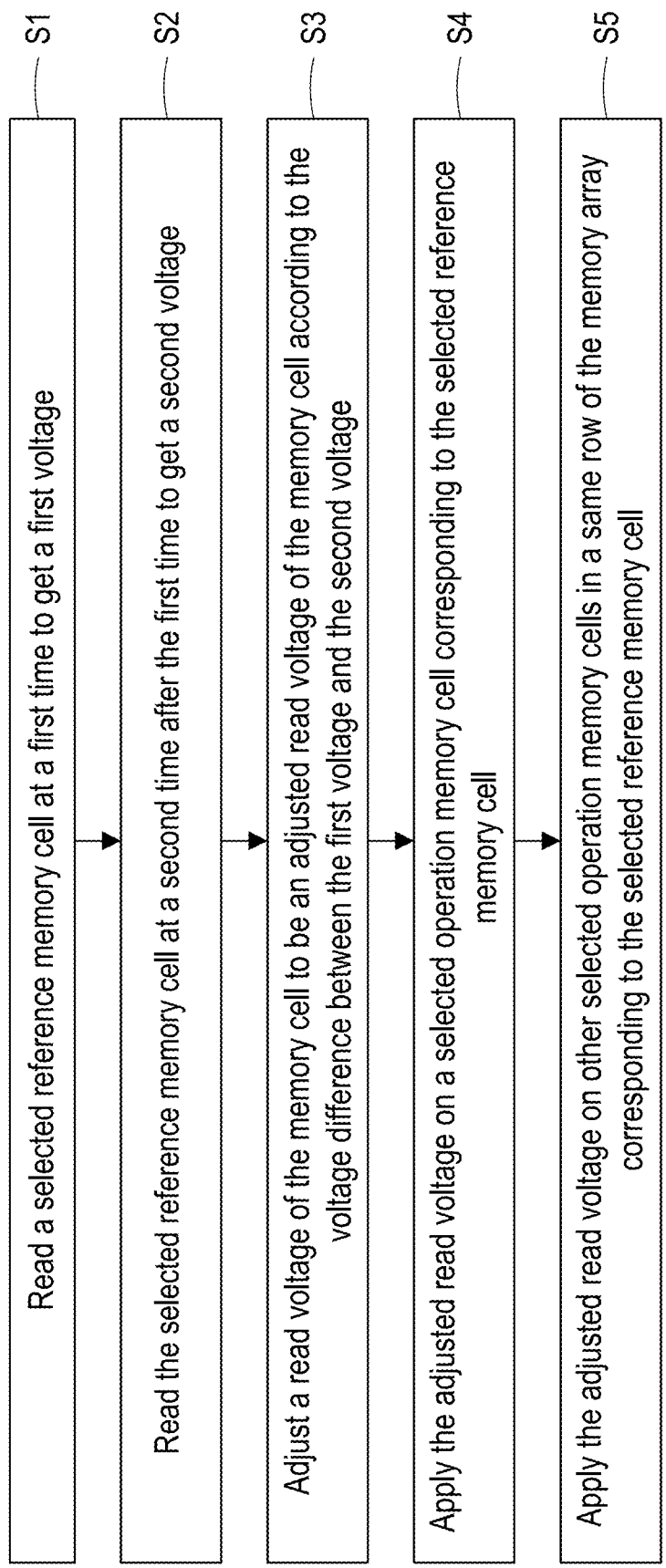
FIG. 5 is a flow diagram illustrating a read method of the memory array with the reference memory cells and the operation memory cells.

FIG. 5 is a flow diagram illustrating a read method of the memory array with the reference memory cells and the operation memory cells.

Referring to FIG. 4 and FIG. 5, the method for reading a memory array in the memory circuit includes the following processes. In step S1, the read circuit 402 reads a selected reference memory cell (e.g., the reference memory cell REFC_1) at a first time to get a first voltage (i.e., the drift threshold voltage $V_{th,drift}$). Further, in step S2, the read circuit 402 reads the selected reference memory cell (e.g., the reference memory cell REFC_1) again at a second time after the first time to get a second voltage (i.e., the non-drift threshold voltage $V_{th,non-drift}$). In other words, the reference memory cell REFC_1 is read twice by the read circuit 402 in a very short time period (less than 0.1 second). That is, the second voltage is the correct voltage of the reference memory cell (or operation memory cell). In some embodiments, the time difference between the first time and the second time is within a range smaller than a predetermined time difference (less than 0.1 second) determined according to characteristics of a corresponding selector. In step S3, the read circuit 402 adjusts the read voltage of the memory cell to be an adjusted read voltage of the memory cell according to the voltage difference between the first voltage and the second voltage (i.e., $V_{th,drift}-V_{th,non-drift}$) and the voltage at one-half the position of the voltage memory window (VMW) (i.e., $V_{1/2\ VWM}$). Wherein the voltage difference between the first voltage and the second voltage is the shift (offset) voltage of the selector (or the memory cell). That is, the adjusted read voltage of the memory cell is equal to a sum of the turn-on voltage of the memory cell, the voltage difference between the first voltage and the second voltage, and a read voltage of the memory cell Therefore, the adjusted read voltage $VR_{adjusted}$ is a correct read voltage and can be calculated following the formula below.

$$VR_{adjusted}=V_{th,non-drift}+(V_{th,drift}-V_{th,non-drift})+V_{1/2\ VWM}$$

In step S4, the read circuit 402 applies the adjusted read voltage $VR_{adjusted}$ on a selected operation memory cell (e.g., the operation memory cell OPC_11) corresponding to the selected reference memory cell (i.e., the reference memory cell REFC_1). As such, the adjusted read voltage $VR_{adjusted}$ is the correct read voltage that lies in the range of the VMW of the selected operation memory cell (e.g., the operation memory cell OPC_11).

In step S5, the read circuit 402 applies the adjusted read voltage $VR_{adjusted}$ on another selected operation memory cell (e.g., the operation memory cell OPC_1N) corresponding to the selected reference memory cell (i.e., the reference memory cell REFC_1). That is, the operation memory cells OPC_11, ..., OPC_1N in the same row are controlled by the same reference memory cell (i.e., the reference memory cell REFC_1). In this way, the operation memory cells OPC_N1, ..., OPC_NN in the same row are controlled by the same reference memory cell (i.e., the reference memory cell REFC_N). In some embodiments, the read circuit 402 can apply the correct reading voltage to a plurality of the operation memory cells OPC_1N, ..., OPC_NN and read out the corresponding voltage (or current) at once. In some embodiments, each reference memory cell is able to correspond to single operation memory cell or a plurality of operation memory cells in the same row depending on the data size or bit number that is needed to be read out.

Figure 6A:
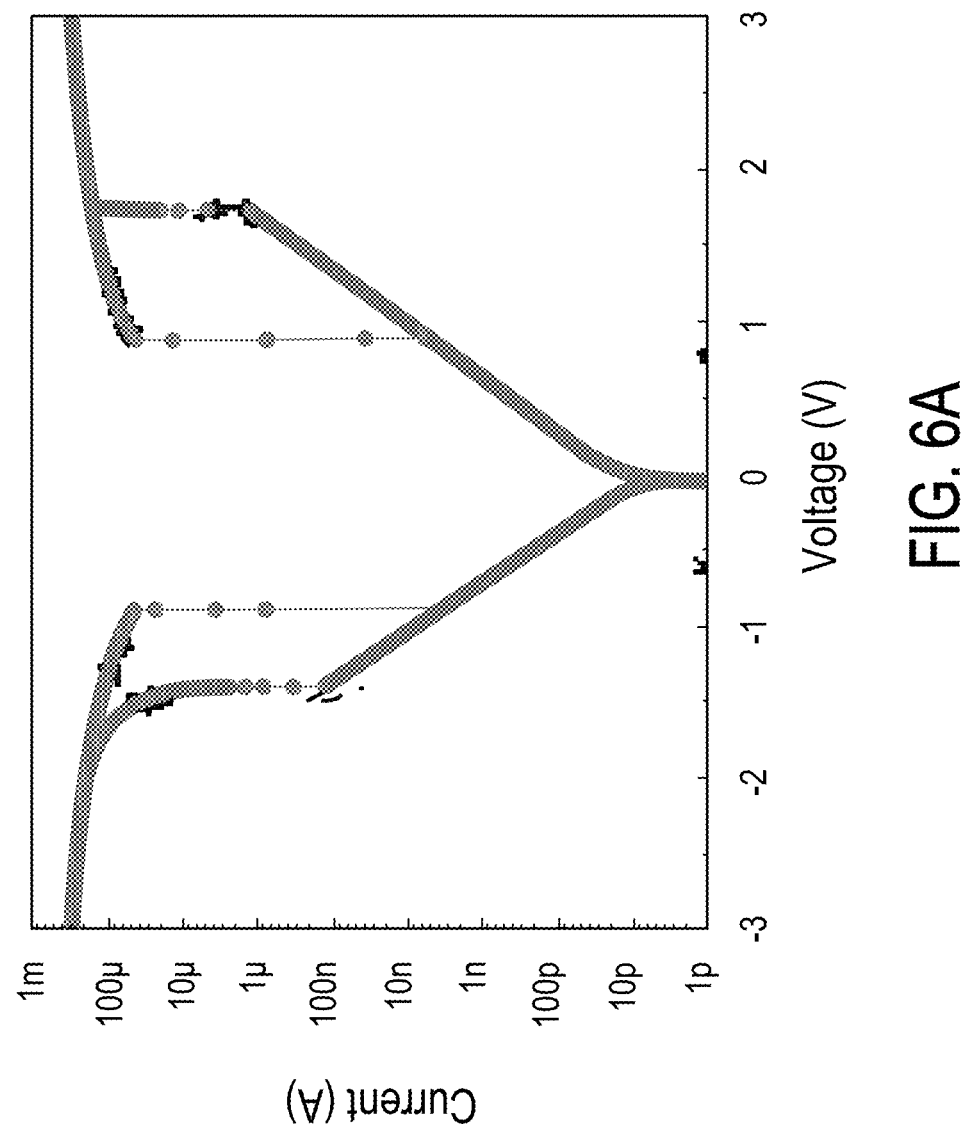
FIG. 6A and FIG. 6B respectively shows an exemplary scheme of the current versus voltage curve of an RRAM and a selector.
Figure 6B:
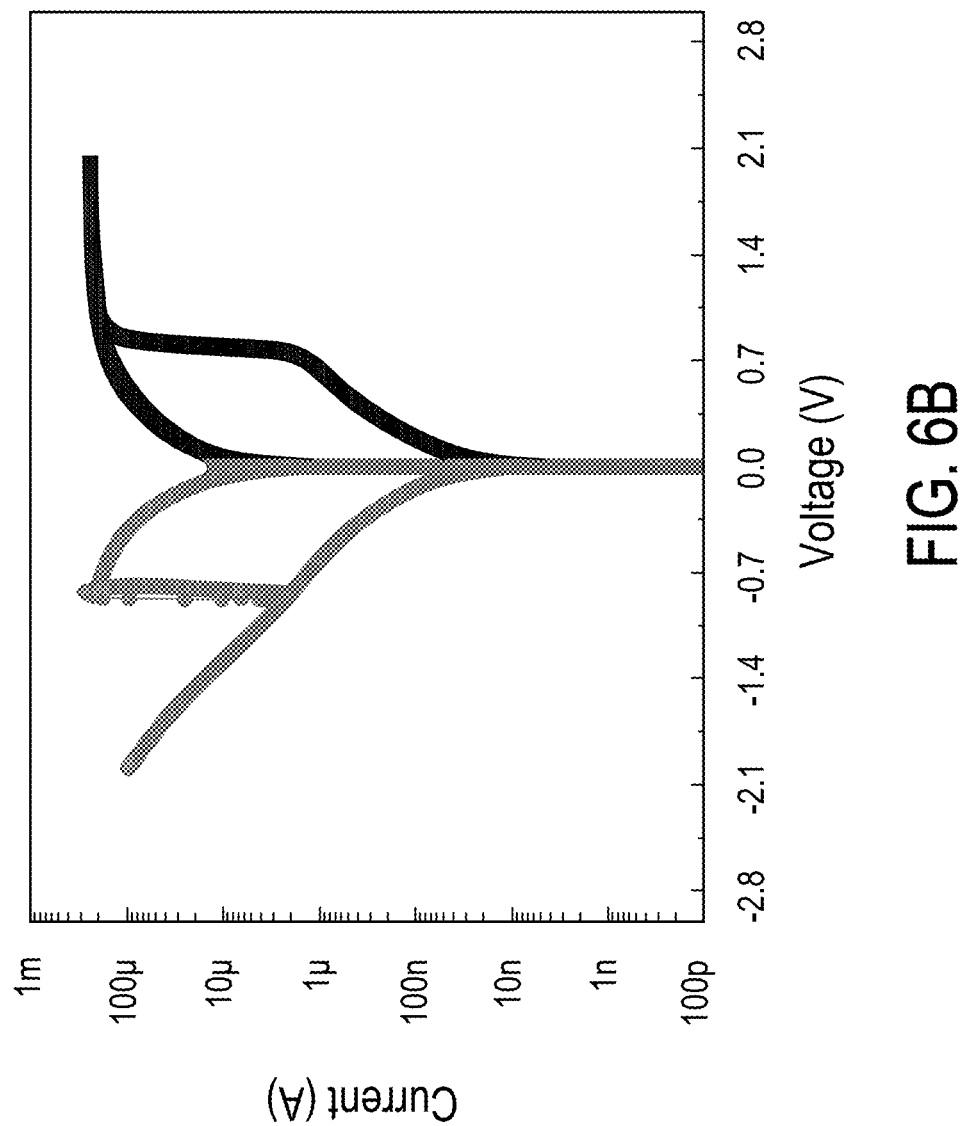
Figure 6C:
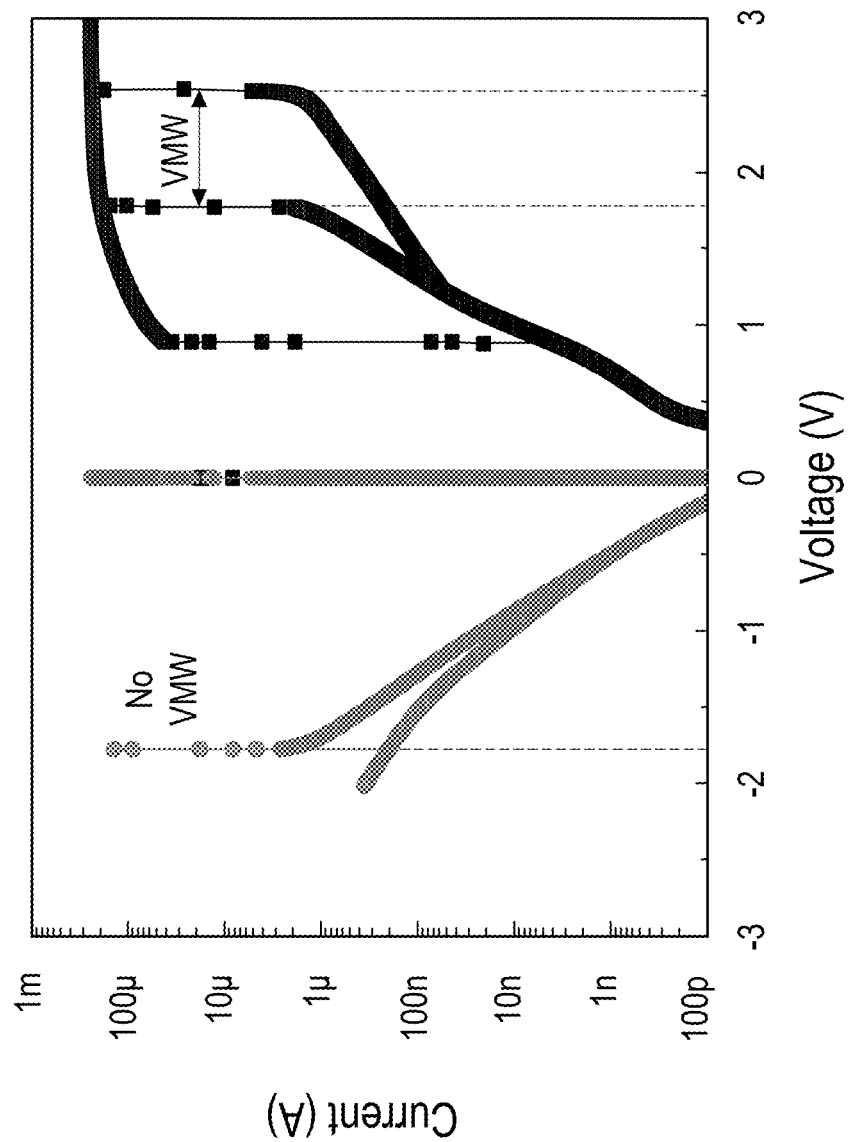
FIG. 6C shows an exemplary scheme of the current versus voltage curve of RRAM integrated with selector.

FIG. 6A and FIG. 6B respectively show an exemplary scheme of the current versus voltage curve of an RRAM and a selector. FIG. 6C shows an exemplary scheme of the current versus voltage curve of RRAM integrated with selector.

Three parameters are employed to describe the threshold switching selectors, namely threshold voltage (Vth), OFF-resistance and ON-resistance. Like RRAM element, there are two distinct states existing in threshold switching selectors, namely OFF-state and ON-state. Take ovonic threshold switch for example, the Poole-Frenkel conduction mechanism accurately accounts for the I-V characteristics in the OFF-state regime. While in the ON-state regime of the selector, it is thought as ohmic because of linear I-V behavior. The current of OFF-state of the selector is usually millesimal or even smaller of the ON-state current. In some embodiment, the non-linearity of selectors is defined as OFF/ON-resistance ratio ranging from 1e3 to 1e5, which is promising for high-density array applications. Once the selector is turned to ON-state, it will keep this state till the applied voltage is removed.

In the memory array, selected selector possesses maximum threshold voltage while others possess minimum threshold voltage. This will lead to some problem during operation.

During set and reset operations, large applied voltage is required to switch selected RRAM element. Thus, partial bias voltage drops on unselected selector is likely to be larger than the minimum threshold voltage. This may cause unselected selectors to turn on. On one hand, ON-state selectors are not able to limit the current of the unselected elements. Leakage current results in the reduction of voltage in selected word line. Consequently, it reduces voltage drop on selected cell and fails the operation. On the other hand, unintentional ON-state selector may result in wrong writing of unselected RRAM element because most of the voltage drops over the RRAM.

During read operation, larger applied voltage for selected cell is demanded for larger maximum threshold voltage. It may lead to unintentional writing of selected RRAM element because most of the voltage will drop on RRAM after selector turns on. In addition, non-selected selectors with minimum threshold voltage may wrongly turn on and increase the readout current. This will make read margin less sharp and even induce wrong read results mixing HRS with LRS. In other cases, HRS is attained if applied voltage is not enough to turn on the selected selector regardless of the real state.

Referring to FIG. 6C, the I-V curve of the selector and RRAM device connected in series is similar to the I-V curve of the single RRAM and the single selector. During the positive scan process, the RRAM-based 1S1R memory cell has a VMW determined by the range between the turn-on voltage V3 of the selector (or the turn-on voltage of the RRAM-based 1S1R memory cell) and the set voltage V4 of the 1S1R memory cell (i.e., the turn-on voltage of RRAM plus the turn-on voltage of the selector). In other words, the voltage gap or VMW is the turn-on voltage of RRAM. In some embodiments, the turn-on voltage of RRAM is set to be larger than 2V. In some embodiments, the VMW is from 1.5V to 2V.

During the positive read (scan) process, the VMW of RRAM is unstable due to the influence of time dependent dielectric breakdown (TDDB). That is, the breakdown voltage of RRAM is related to the defect quality of its dielectric layer. The more the number of the defect, the lower the breakdown voltage. In other words, the lower the breakdown voltage, the lower the turn-on voltage. Since the number of defects and the location of defects in RRAM are not fixed, the breakdown voltage varies drastically. Because of the large variation of breakdown voltage, the stability of the memory window or VMW during positive read (scan) is not stable enough. In addition, different RRAM cell leads to different VMW, which influences the read performance and information accuracy of the memory cell.

As such, referring to FIG. 6C, the negative scan is preferable owing to the stable negative turn-on voltage V5 of RRAM-based memory cell. However, there is no VMW during the negative read (scan) process, thus the negative read voltage cannot be applied during negative scan process. In other words, when the applied negative voltage is larger enough than the negative turn-on voltage (or reset voltage) V5 of the RRAM-based memory cell, the RRAM will turn on first and then get part of the voltage on RRAM in a short period of time. As such, RRAM changes from a low resistance state to a high resistance state instantaneously, leading the RRAM-based memory cell in a high resistance state and therefore the VMW cannot be formed.

In consequence, in an embodiment of the present disclosure, the voltage divider is introduced to share the turn-on voltage on RRAM and keep RRAM in the low resistance state, thus contributing an opened VMW.

Figure 7:
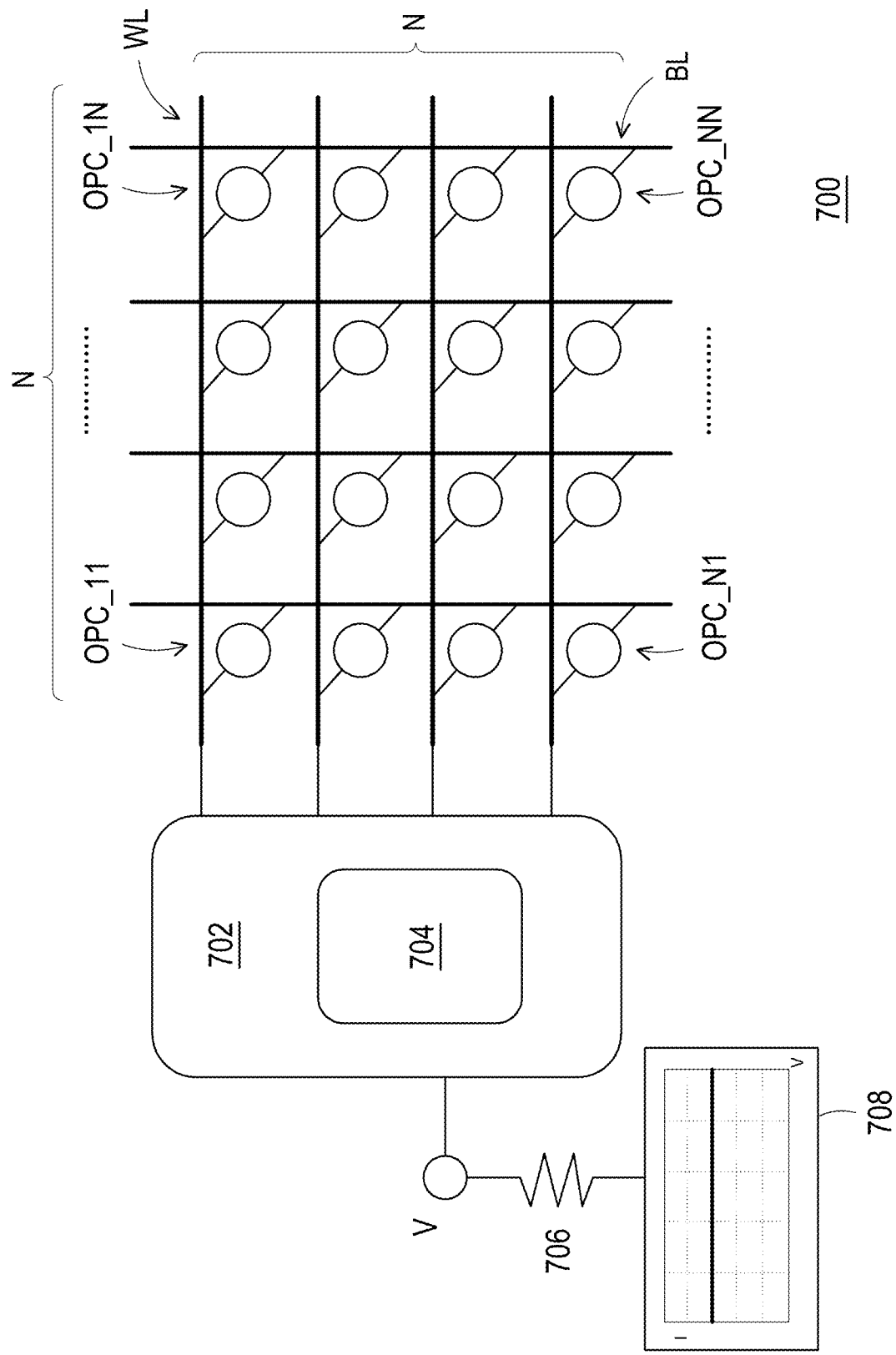
FIG. 7 shows an exemplary scheme of a memory circuit including a read circuit with an external voltage divider and a 3D crossbar RRAM array architecture according to an embodiment of the present disclosure.

FIG. 7 shows an exemplary scheme of a memory circuit including a read circuit with an external voltage divider and a 3D crossbar RRAM array architecture according to an embodiment of the present disclosure.

Referring to FIG. 6C and FIG. 7, in an embodiment of the present disclosure, the memory circuit 700 includes an N×N memory array, a processing circuit 702, a voltage divider 706, and an oscilloscope 708. The memory array includes bit lines BL, word lines WL, and operation memory cells $OPC\_11, \ldots, OPC\_NN$. The processing circuit 702 includes a read circuit 704. The voltage divider 706 can be any device that can share the voltage with the selected RRAM-based memory cell (e.g., the operation memory cell $OPC\_11, \ldots, OPC\_NN$). For example, the voltage divider 706 may be a resistor, the disclosure is not limited thereto.

In some embodiments, the voltage divider 706 is connected to the processing circuit 702 sharing the turn-on voltage V on the operation memory cell $OPC\_11, \ldots, OPC\_NN$ and keep RRAM-based memory cell in the low resistance state to contribute an opened VMW during negative read (scan) process. In some embodiments, the operation memory cells in the same column (e.g., $OPC\_11$ and $OPC\_N1$) may be reference memory cells. The reading method of the reference memory cells can be known by referring to the embodiments mentioned above, and the related description is not repeated here. In some embodiments, the oscilloscope 708 can be used to observe the I-V curve of the memory cell. In some embodiments, the voltage divider 706 provides external resistance path to share the voltage on RRAM cell.

Figure 8:
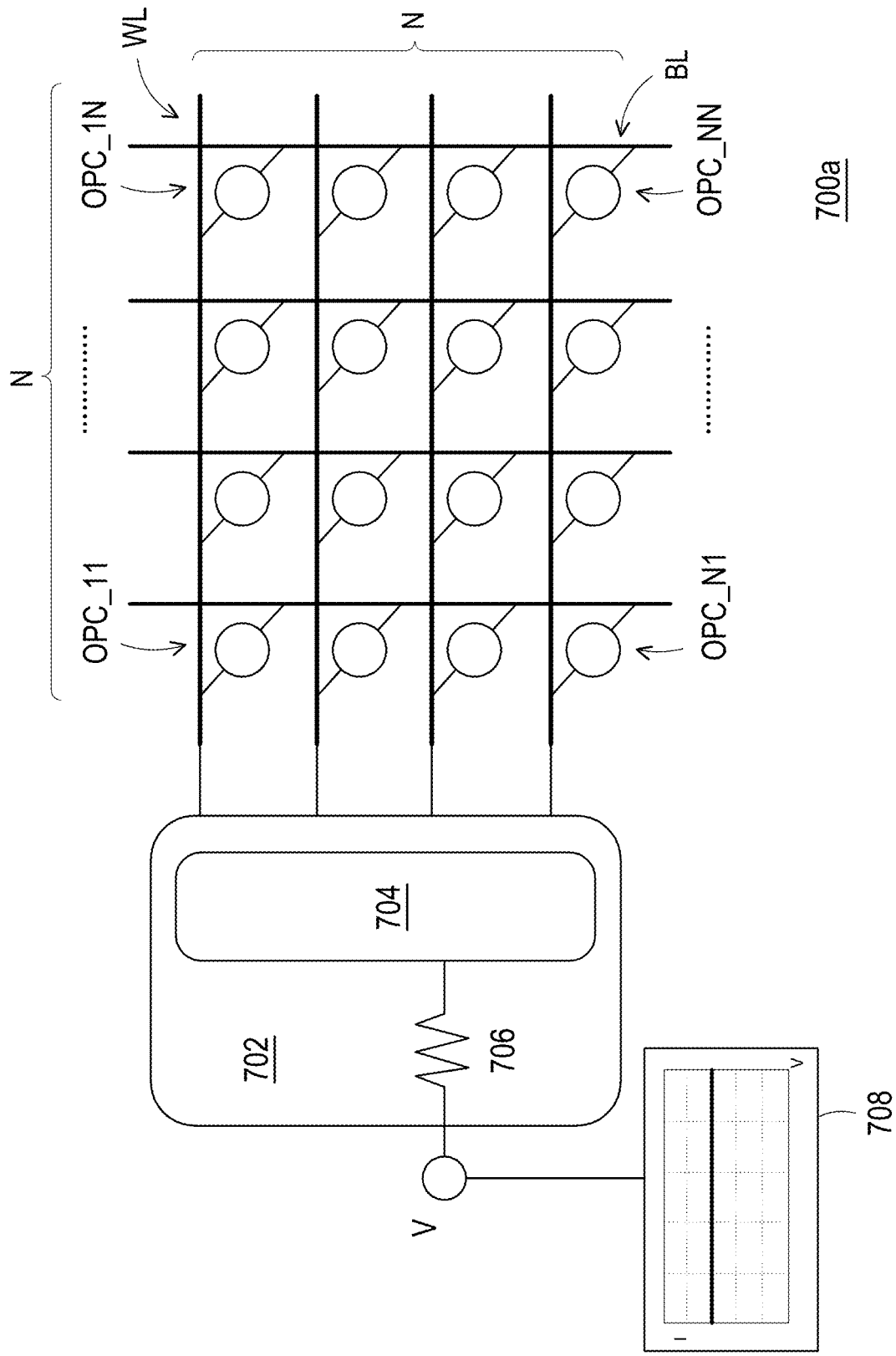
FIG. 8 shows an exemplary scheme of a memory circuit including a read circuit with an external voltage divider and a 3D crossbar RRAM array architecture according to another embodiment of the present disclosure.

FIG. 8 shows an exemplary scheme of a memory circuit including a read circuit with an external voltage divider and a 3D crossbar RRAM array architecture according to another embodiment of the present disclosure.

Referring to FIG. 6C and FIG. 8, in an embodiment of the present disclosure, the memory circuit 700a includes an N×N memory array, a processing circuit 702, and an oscilloscope 708. The memory array includes bit lines BL, word lines WL, and operation memory cells $OPC\_11, \ldots, OPC\_NN$. The processing circuit 702 includes a read circuit 704 and a voltage divider 706. The voltage divider 706 can be any device that can share the voltage with the selected RRAM-based memory cell (e.g., the operation memory cells $OPC\_11, \ldots, OPC\_NN$). For example, the voltage divider 706 may be a resistor, but the disclosure is not limited thereto. In some embodiments, the voltage divider 706 is connected to the read circuit 704 sharing the turn-on voltage V on the operation memory cells $OPC\_11, \ldots, OPC\_NN$ and keep RRAM-based memory cell in the low resistance state to contribute an opened VMW during negative read (scan) process.

Figure 9:
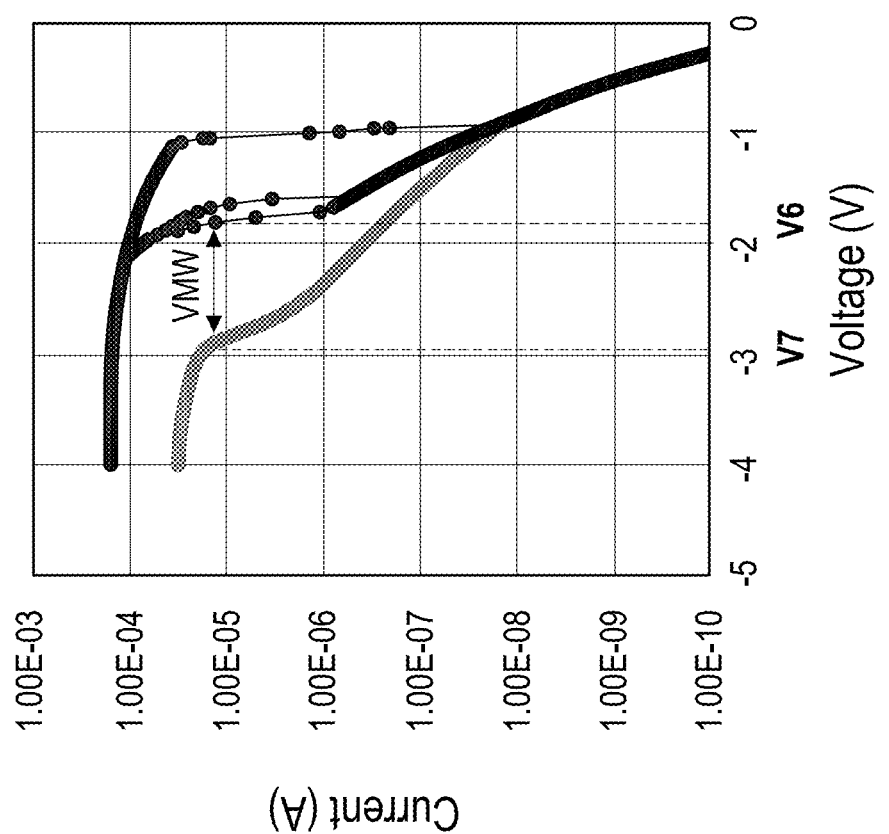
FIG. 9 shows an exemplary scheme of the current versus voltage curve of the memory cell by using a read circuit with an external voltage divider, in accordance with some embodiments of the present disclosure.

FIG. 9 shows an exemplary scheme of the current versus voltage curve of the memory cell by using a read circuit with an external voltage divider, in accordance with some embodiments of the present disclosure.

Referring to FIG. 9, during the negative read process, the voltage divider is introduced to share the turn-on voltage V6 on RRAM and the reset voltage V7 on the RRAM-based 1S1R memory cell to keep RRAM in the low resistance state, thus contributing an opened VMW. That is, the size of VMW is enlarged by limited current during negative read process.

The present disclosure relates to a memory device having an inserted selector. The read method is to trace the reference memory cell in a given memory block (or in the same row), and adjust read voltage accordingly. Therefore, the memory circuit is able to apply the correct read voltage. Further, the external voltage divider (or resistor) is introduced into the RRAM-based 1S1R memory cell to enlarge VMW by limited current during negative read. Therefore, the RRAM-based 1S1R memory cell can be operated in the negative read process and the reliability of the RRAM device can be improved.

According to some embodiments, a method for reading a memory array is provided. The memory array includes reference memory cells and operation memory cells. The method includes: reading a selected reference memory cell at a first time to get a first voltage; reading the selected reference memory cell at a second time after the first time to get a second voltage; adjusting a read voltage of the memory cell to be an adjusted read voltage of the operation memory cell according to a voltage difference between the first voltage and the second voltage; applying the adjusted read voltage on a selected operation memory cell corresponding to the selected reference memory cell; and applying the adjusted read voltage on other selected operation memory cells in a same row of the memory array corresponding to the selected reference memory cell. The time difference between the first time and the second time is within a range smaller than a predetermined time difference determined according to characteristics of a corresponding selector in the selected reference memory cell or the selected operation memory cell.

According to some embodiments, each row of the memory array comprises at least one reference memory cell, and each reference memory cell corresponds to at least one operation memory cell in the same row of the memory array. In some embodiments, each operation memory cell comprises a memory device and a selector electrically coupled to the memory device, and wherein each operation memory cell is read in either a low resistance state or a high resistance state. In some embodiments, each reference memory cell comprises only one selector electrically coupled to the memory array. In some embodiments, each reference memory cell comprises a memory device and a selector electrically coupled to the memory device, and wherein each reference memory cell is read in a low resistance state. In some embodiments, the selector comprises chalcogenide materials. In some embodiments, a turn-on voltage of the memory cell is a voltage of the memory device in high resistance state. In some embodiments, a turn-on voltage of the memory cell is larger than a turn-on voltage of the selector. In some embodiments, the read voltage of the memory cell is substantially half of a sum of a set voltage of the memory cell and the turn-on voltage of the memory cell. In some embodiments, the adjusted read voltage of the memory cell is equal to a sum of the turn-on voltage of the memory cell, the voltage difference between the first voltage and the second voltage, and a read voltage of the memory cell.

According to another embodiment, a method for reading a memory circuit is provided. The memory circuit includes a read circuit, a memory array, and a processing circuit connected to the memory array. The memory array includes reference memory cells, electrically coupled to the read circuit; and operation memory cells, electrically coupled to the read circuit and the respective reference memory cells. The method includes: reading a selected reference memory cell by the read circuit at a first time to get a first voltage; reading the selected reference memory cell by the read circuit at a second time after the first time to get a second voltage; adjusting a read voltage of the memory cell to be an adjusted read voltage of the memory cell by the read circuit according to a voltage difference between the first voltage and the second voltage; applying the adjusted read voltage by the processing circuit on a selected operation memory cell corresponding to the selected reference memory cell; and applying the adjusted read voltage by the processing circuit on other selected operation memory cells in a same row of the memory array corresponding to the selected reference memory cell, wherein a time difference between the first time and the second time is within a range smaller than a predetermined time difference determined according to characteristics of a corresponding selector in the selected reference memory cell or the selected operation memory cell.

According to some embodiments, the selector comprises one of a chalcogenide material, an ovonic threshold switching material, a transition metal oxide switching material, a mixed ion-electron conductor (MIEC) switching material, a complementary resistor switching material, or a doped amorphous silicon. In some embodiments, a scan voltage applied to the memory array through a bit line and/or a word line is a pulse voltage that changes with time. In some embodiments, the memory device of the memory circuit comprises one of a resistive random access memory (RRAM), a phase change random access memory (PCRAM), and a magnetoresistive random access memory (MRAM). In some embodiments, the adjusted read voltage of the memory cell is equal to a sum of a turn-on voltage of the memory device, a voltage difference between the first voltage and the second voltage, and a read voltage of the memory cell, wherein the read voltage of the memory cell is substantially half of the sum of the turn-on voltage of the memory device and the turn-on voltage of the memory cell.

According to some embodiments, a memory circuit including a read circuit, a memory array, and a processing circuit connected to the memory array is provided. The memory array is electrically coupled to the read circuit. The memory array includes a plurality of reference memory cells and a plurality of operation memory cells. The read circuit reads a selected reference memory cell of the plurality of reference memory cells at a first time to get a first voltage, reads the selected reference memory cell of the plurality of reference memory cells at a second time after the first time to get a second voltage, and adjusts a read voltage of the an operation memory cell to be an adjusted read voltage of the memory cell according to a voltage difference between the first voltage and the second voltage. The read circuit applies the adjusted read voltage on a selected operation memory cell of the plurality of operation memory cells corresponding to the selected reference memory cell. Each operation memory cell includes a resistive memory device and a selector electrically coupled to the resistive memory device. The time difference between the first time and the second time is within a range smaller than a predetermined time difference according to characteristics of a corresponding selector in the selected reference memory cell or the selected operation memory cell.

According to some embodiments, the memory circuit further includes a voltage divider connected with the read circuit. The voltage divider shares a negative read voltage with the resistive memory device during negative reading process and maintains the selected operation memory cell in a low resistance state. In some embodiments, the voltage divider is an external resistor connected with the read circuit in series and is disposed either in the read circuit or outside the read circuit. In some embodiments, each of the plurality of operation memory cells comprises a memory device and a selector electrically coupled to the memory device and wherein the memory device is a random-access memory (RRAM).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for reading a memory array, the memory array comprises reference memory cells and operation memory cells, the method comprising:
    reading a selected reference memory cell at a first time to get a first voltage;
    reading the selected reference memory cell at a second time after the first time to get a second voltage;
    adjusting a read voltage of the operation memory cell to be an adjusted read voltage of the memory cell according to a voltage difference between the first voltage and the second voltage;
    applying the adjusted read voltage on a selected operation memory cell corresponding to the selected reference memory cell; and
    applying the adjusted read voltage on other selected operation memory cells in a same row of the memory array corresponding to the selected reference memory cell,
    wherein a time difference between the first time and the second time is within a range smaller than a predetermined time difference determined according to characteristics of a corresponding selector in the selected reference memory cell or the selected operation memory cell.

2. The method of claim 1, wherein each row of the memory array comprises at least one reference memory cell, and each reference memory cell corresponds to at least one operation memory cell in the same row of the memory array.

3. The method of claim 1, wherein each operation memory cell comprises a memory device and a selector electrically coupled to the memory device, and wherein each operation memory cell is read in either a low resistance state or a high resistance state.

4. The method of claim 1, wherein each reference memory cell comprises only one selector electrically coupled to the memory array.

5. The method of claim 1, wherein each reference memory cell comprises a memory device and a selector electrically coupled to the memory device, and wherein each reference memory cell is read in a low resistance state.

6. The method of claim 5, wherein the selector comprises chalcogenide materials.

7. The method of claim 1, wherein a turn-on voltage of the memory cell is a voltage of the memory device in high resistance state.

8. The method of claim 7, wherein a turn-on voltage of the memory cell is larger than a turn-on voltage of the selector.

9. The method of claim 8, wherein the read voltage of the memory cell is substantially half of a sum of a set voltage of the memory cell and the turn-on voltage of the memory cell.

10. The method of claim 9, wherein the adjusted read voltage of the memory cell is equal to a sum of the turn-on voltage of the memory cell, the voltage difference between the first voltage and the second voltage, and a read voltage of the memory cell.

11. A method for reading a memory circuit, the memory circuit comprises a read circuit, a memory array and a processing circuit connected to the memory array, wherein the memory array comprises:
    a plurality of reference memory cells, electrically coupled to the read circuit; and
    a plurality of operation memory cells, electrically coupled to the read circuit and the respective reference memory cells, the method comprising:
        reading a selected reference memory cell by the read circuit at a first time to get a first voltage;
        reading the selected reference memory cell by the read circuit at a second time after the first time to get a second voltage;
        adjusting a read voltage of the operation memory cell to be an adjusted read voltage of the memory cell by the read circuit according to a voltage difference between the first voltage and the second voltage;
        applying the adjusted read voltage by the processing circuit on a selected operation memory cell corresponding to the selected reference memory cell; and
        applying the adjusted read voltage by the processing circuit on other selected operation memory cells in a same row of the memory array corresponding to the selected reference memory cell, wherein a time difference between the first time and the second time is within a range smaller than a predetermined time difference determined according to characteristics of a corresponding selector in the selected reference memory cell or the selected operation memory cell.

12. The method of claim 11, wherein each row of the memory array comprises at least one reference memory cell, and each reference memory cell corresponds to at least one operation cell in the same row of the memory array.

13. The method of claim 11, wherein each operation memory cell comprises a memory device and a selector electrically coupled to the memory device, and wherein each operation memory cell is read in either a low resistance state or a high resistance state.

14. The method of claim 11, wherein the selector comprises one of a chalcogenide material, an ovonic threshold switching material, a transition metal oxide switching material, a mixed ion-electron conductor (MIEC) switching material, a complementary resistor switching material, or a doped amorphous silicon.

15. The method of claim 11, wherein a scan voltage applied to the memory array through a bit line or a word line is a pulse voltage that changes with time.

16. The method of claim 11, wherein the adjusted read voltage of the memory cell is equal to a sum of a turn-on voltage of the memory device, a voltage difference between the first voltage and the second voltage, and a read voltage of the memory cell, wherein the read voltage of the memory cell is substantially half of the sum of the turn-on voltage of the memory device and the turn-on voltage of the memory cell.

17. A memory circuit, comprising:
    a read circuit; and
    a memory array, electrically coupled to the read circuit, wherein the memory array comprises:
        a plurality of reference memory cells, wherein the read circuit reads a selected reference memory cell of the plurality of reference memory cells at a first time to get a first voltage, reads the selected reference memory cell at a second time after the first time to get a second voltage, and adjusts a read voltage of an operation memory cell to be an adjusted read voltage of the memory cell according to a voltage difference between the first voltage and the second voltage; and a plurality of operation memory cells, wherein the read circuit applies the adjusted read voltage on a selected operation memory cell of the plurality of operation memory cells corresponding to the selected reference memory cell, wherein a time difference between the first time and the second time is within a range smaller than a predetermined time difference determined according to characteristics of a corresponding selector in the selected reference memory cell or the selected operation memory cell.

18. The memory circuit of claim 17, further comprising a voltage divider connected with the read circuit, wherein the voltage divider shares a negative read voltage with the resistive memory device during a negative reading process and maintains the selected operation memory cell in a low resistance state.

19. The memory circuit of claim 17, wherein the voltage divider is an external resistor connected with the read circuit in series and is disposed either in the read circuit or outside the read circuit.

20. The memory circuit of claim 17, wherein each of the plurality of operation memory cells comprises a memory device and a selector electrically coupled to the memory device and wherein the memory device is a random-access memory (RRAM).

* * * * *